(12) United States Patent
Giovannone et al.

(10) Patent No.: US 8,183,904 B2
(45) Date of Patent: May 22, 2012

(54) CONTROL SYSTEM FOR A PHASE GENERATOR AND CORRESPONDING CONTROL METHOD

(75) Inventors: Juri Giovannone, Cernobbio (IT); Roberto Giorgio Bardelli, Fino Mornasco (IT); Giovanni Cremonesi, Fiorenzuola d' Arda (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 0 days.

(21) Appl. No.: 12/980,486

(22) Filed: Dec. 29, 2010

(65) Prior Publication Data
US 2011/0156789 A1  Jun. 30, 2011

(30) Foreign Application Priority Data
Dec. 29, 2009 (IT) .............................. MI2009A2323

(51) Int. Cl.
*H03K 5/13* (2006.01)

(52) U.S. Cl. ......... 327/236; 327/234; 327/158; 327/159

(58) Field of Classification Search ................... 327/149, 327/150, 158, 159, 161, 231–237
See application file for complete search history.

(56) References Cited

U.S. PATENT DOCUMENTS

| | | |
|---|---|---|
| 6,794,913 B1 | 9/2004 | Stengel .......................... 327/158 |
| 7,642,831 B2 * | 1/2010 | Nguyen ......................... 327/231 |
| 2007/0075785 A1 | 4/2007 | Kossel et al. .................... 331/16 |
| 2010/0072979 A1 * | 3/2010 | Fefer et al. ................. 324/76.77 |

OTHER PUBLICATIONS

Kratyuk et al., "A Design Procedure for All-Digital Phase-Locked Loops Based on a Charge-Pump Phase-Locked-Loop Analogy", IEEE Transactions on Circuits and Systems II: Express Briefs, IEEE Service Center, New York, NY, US, DOI:10.1109/TCSII.2006. 889443, vol. 54, No. 3, Mar. 1, 2007, pp. 247-251.

* cited by examiner

*Primary Examiner* — An Luu
(74) *Attorney, Agent, or Firm* — Allen, Dyer, Doppelt, Milbrath & Gilchrist, P.A.

(57) ABSTRACT

A control system for a phase generator including a delay block including delay units, and first and second multiplexers configured to receive output signals of each of the delay units and to respectively supply first and second output signals. The control system may include a controller configured to drive the first multiplexer and the second multiplexer respectively with a first select signal and a second select signal, a detection module configured to detect a phase difference between the first output signal and the second output signal and to generate a corresponding digital phase shift signal, the detection module including a phase comparator, and a Time-Digital converter circuit coupled thereto and having logic elements configured to generate the digital phase shift signal, and a logic circuit connected to the detection module and configured to process the digital phase shift signal and to generate a signal indicative of a control executed.

16 Claims, 6 Drawing Sheets

CONTROL SYSTEM FOR A PHASE GENERATOR AND CORRESPONDING CONTROL METHOD

FIELD OF THE INVENTION

The present disclosure relates to a control system for a phase generator and a control method for the phase generator.

BACKGROUND OF THE INVENTION

Development of electronics technology has led to wide use of phase generators, in particular, phase generators including Delay Locked Loop (DLL) circuits and Phase Locked Loop (PLL) circuits. In general, DLL circuits allow generation of a certain number of output signals out of phase with respect to an input clock signal while PLL circuits allow generation of output signals whose phase has a fixed relation with the phase of a reference signal or clock signal.

FIG. 1 shows a typical architecture of a phase generator 1 comprising a DLL circuit. The DLL circuit may comprise a delay block Voltage Controlled Delay Line (VCDL), which in turn may comprise a chain of delay units being variable and adjustable in voltage, interposed between the input terminal and the output terminal of the delay block VCDL.

The delay units may be arranged in cascade with each other with the respective output terminals connected to the input terminals of the successive delay units. The delay block VCDL may receive at the input terminal the external clock signal CLKA and may generate at the output terminal a delayed clock signal CLKB, which is a copy of the external clock signal CLKA, delayed by the delay units exactly by a clock cycle. The DLL circuit also may comprise a control loop for feedback regulating the delay block VCDL using the delayed clock signal CLKB.

The control loop may comprise a Phase Detector PD that detects the phase delay between the external clock signal CLKA and the delayed clock signal CLKB and provides an impulse signal proportional to the phase difference detected. In particular, it may provide a first output signal UP if the external clock signal CLKA is in advance with respect to the delayed clock signal CLKB and a second output signal DOWN in the opposite case.

The control loop also may comprise a converter CP (Charge Pump) that allows conversion of the phase difference detected by the phase detector block PD into a current difference which, integrated on a capacity, generates a control signal Vc that feedback controls the delay units of the delay block VCDL. The phase generator 1 also may comprise a multiplexer MUX0 connected to the delay block VCDL of the circuit DLL. The multiplexer MUX0 may be driven by a select signal mux_sel_ch_0 so as to select one between the output signals of the delay units. Each signal at the output of the delay units of the delay block VCDL may be delayed with respect to the respective input signal by a fraction equal to 1/N of the period of the external clock signal CLKA, where N is the total number of the delay units in the delay block VCDL.

In consequence, by selecting through the signal mux_sel_ch_0 the n-th delay unit of the delay block VCDL, an output signal OUT0 of the multiplexer MUX0 comes comprises a delayed signal with respect to the external clock signal CLKA by a value equal to n/N of the period of the external clock signal CLKA. The phase generator 1 may also comprise a second multiplexer MUX1 connected to the delay block VCDL of the circuit DLL, substantially identical to the first multiplexer MUX0, which, driven by a second select signal mux_sel_ch_1, selects one among the output signals of the delay units for bringing back to its own output terminal an output signal OUT1 that is a delayed signal with respect to the external clock signal CLKA by a value equal to n/N of the period of the external clock CLKA (where n stands for the number of the delay units selected through the signal mux_sel_ch_1 and N stands for the number of the delay units in the block VCDL).

With the introduction of the second multiplexer, it may be possible to bring back to the output signals with delays different with respect to the external clock signal CLKA, so as to meet specific needs of the applications. A phase generator realized with the PLL circuit may have an oscillator controlled in voltage and a control loop which feedback regulates the oscillator by using the output signal of the oscillator compared with the external clock signal. The oscillator may be realized with a chain of delay units loop-locked connected in a similar way as the delay block VCDL above described.

The phase generators realized with circuits DLL or PLL may have to be suitably controlled or tested for verifying the good operation of the same. The typical tests may provide to verify:

1. malfunctions of the delay units;
2. malfunctions of the multiplexers MUX;
3. that there is a "monotonous" behavior among the select signals at the input and the respective phase shift of the signals output from each multiplexer with respect to the external clock signal CLKA; and
4. a linearity in the delay of the output signal OUT of the signal generator with respect to the external clock signal CLKA.

For each type of test indicated, a series of rather elaborate measures may be necessary, which use the accurate and precise machines or instruments able to measure very short times, of the order of the switch of one of the delay units of the chain, thus substantially of the order of the picoseconds. These apparatuses may be expensive.

Moreover, the times requested for carrying out the predefined measures may be particularly long and rather burdensome. For example, in the case of the test for malfunction of the delay units, it may be necessary to measure the output signal of each delay unit of the chain and to compare this measure with the measure of the output signal of the successive delay units, as well as to compare all their combinations. According to the application, these types of testing can be all or in part carried out, but in any case, although advantageous under several aspects, such approaches may be long and expensive.

SUMMARY OF THE INVENTION

The technical problem underlying the present disclosure is that of providing a control system and a corresponding control method for carrying out quickly and with high precision the types of testing requested and without expensive devices and as well as having such structural and functional characteristics as to overcome the limits still affecting the phase generators realized according to the prior art.

An approach to the technical problem is a control system for a phase generator that may comprise a delay block that has a chain of delay units, a first multiplexer and a second multiplexer suitable for receiving at the input the output signals of each of the delay units for supplying a first output signal and a second output signal. The control system may comprise control means or a controller/control unit suitable for driving respectively the first multiplexer and the second multiplexer using respectively of a first select signal and a second select signal for supplying the first output signal and the second output signal, and detect means or a detect module suitable for detecting the phase difference between the first output signal and the second output signal and to generate a corresponding digital phase shift signal. The detect module may comprise a phase comparator connected to a Time-Digital converter circuit having in turn a plurality of logic elements suitable for generating the digital phase shift signal. The control system may include control logic means or a logic circuit connected to the detect module and suitable for processing the digital phase shift signal for generating a signal indicative of the control executed.

The phase comparator may be arranged for receiving the first output signal and the second output signal and is suitable for driving the Time-Digital converter circuit with a first comparator signal and a second comparator signal. In particular, the Time-Digital converter circuit may comprise the plurality of logic elements having respective output terminals connected to the control logic circuit.

Advantageously, the control unit may receive at least one control signal from the control logic circuit for generating the first select signal and the second select signal. The control unit may receive at least one control signal from the control logic circuit for generating the first select signal and the second select signal. Advantageously, the control logic circuit and the control unit may comprise a respective testing program.

Another aspect is directed to a control method for a phase generator comprising a delay block which has a chain of delay elemental units, and a first multiplexer and a second multiplexer, the first multiplexer and the second multiplexer suitable for receiving at the input the output signals of each of the delay elemental units for supplying a first output signal and a second output signal respectively selected by the input signals. The method may include generating a first select signal for driving the first multiplexer suitable for supplying the first output signal and generating a second select signal for driving the second multiplexer suitable for supplying the second output signal, detecting the phase difference between the first output signal and the second output signal and emitting a corresponding digital phase shift signal by employing a Time-Digital converter realized with a plurality of logic elements, and processing the digital phase shift signal for generating a signal indicative of the control executed.

Advantageously, the method may provide generation of a first comparator signal and a second comparator signal with a phase comparator controlled by the first output signal and by the second output signal for driving the plurality of logic elements and in that it connects the output terminals of the plurality of logic elements to control logic circuit for processing the digital phase shift signal. Suitably, the method may provide that the phase of generating the first select signal and the second select signal provides processing of at least one control signal generated by the logic circuit. The method may provide programming of the logic circuit and the control unit with respective testing program.

The characteristics and the advantages of the control device and system and of the control method according to the present disclosure may be apparent from the following description of an embodiment thereof given by way of indicative and non limiting example with reference to the annexed drawings.

DETAILED DESCRIPTION OF THE PREFERRED EMBODIMENTS

Figure 1:
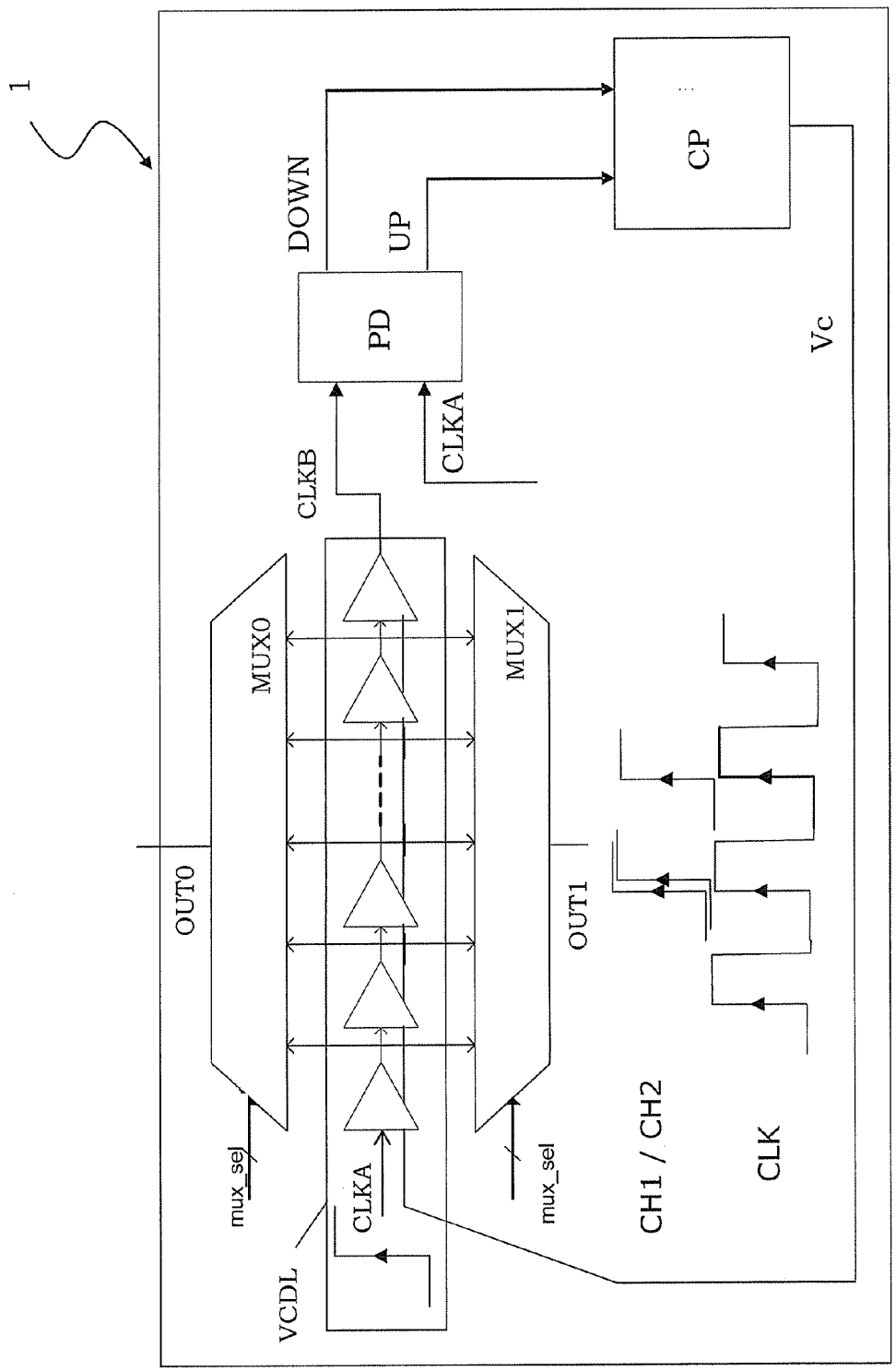
FIG. 1 shows a schematic block diagram of a phase generator, according to the prior art.
Figure 2:
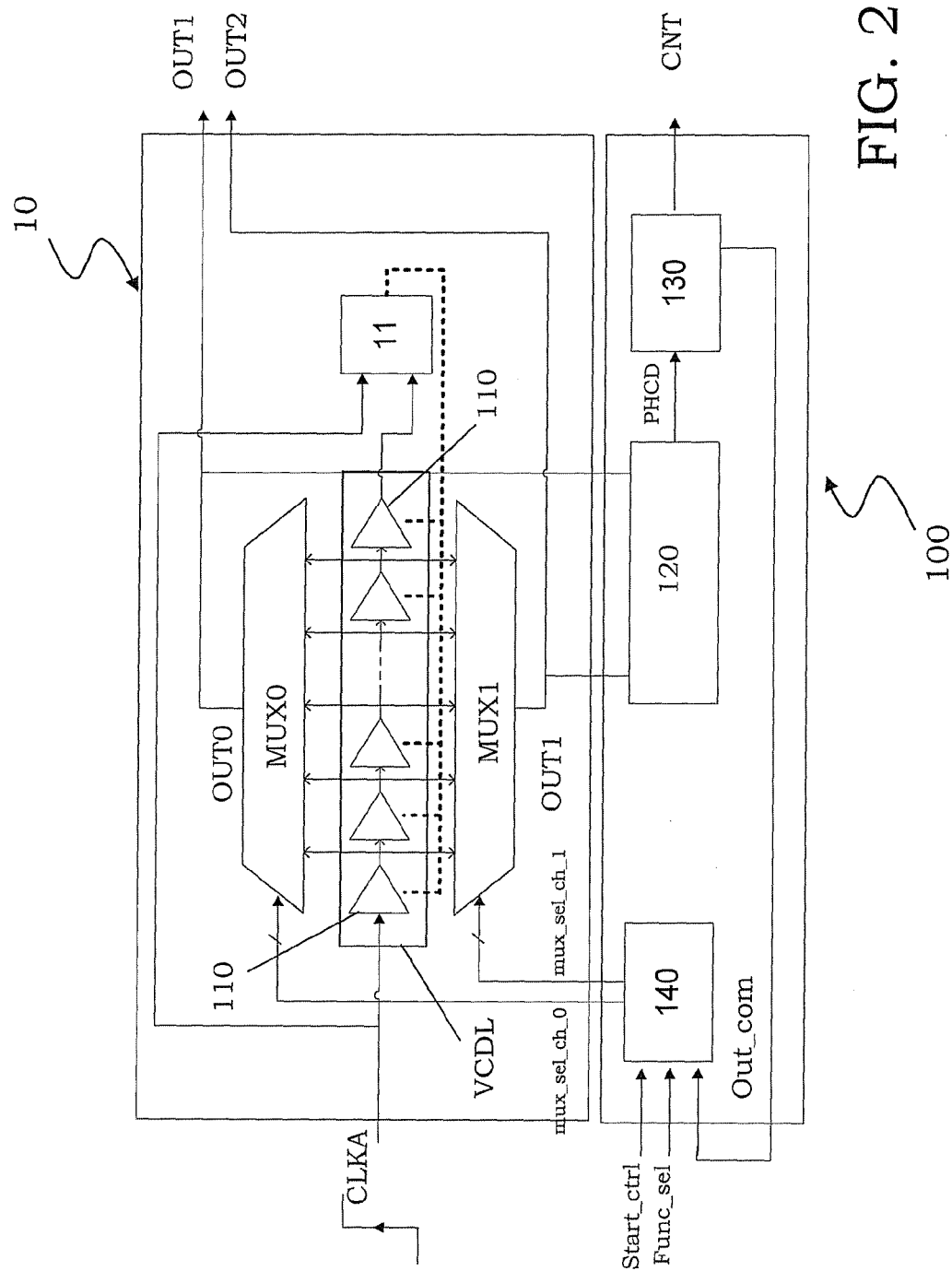
FIG. 2 shows a schematic block diagram of a control system for a phase generator, according to the present invention.

With reference to these figures, and in particular to FIG. 2, 100 globally and schematically indicates a control system for a phase generator 10. The phase generator 10 is of the type previously described for which details and cooperating parts having the same structure and function may be indicated with the same reference numbers and acronyms. The phase generator 10 comprises a delay block VCDL which is connected to a feedback block 11.

The delay block VCDL receives an external clock signal CLKA and generates at the output a delayed clock signal CLKB, which is delayed by a clock cycle with respect to the external clock signal CLKA. The feedback block 11 receives the delayed clock signal CLKB and also the external clock signal CLKA and generates a voltage control signal Vc for driving in feedback the delay block VCDL.

The delay block VCDL comprises a plurality of delay elemental units 110, each with delay variable and adjustable in voltage. The delay elemental units 110 are arranged in chain with each other, interposed between the input terminal and the output terminal of the delay block VCDL. The delay elemental units 110 have the respective output terminals connected to the input terminals of the successive delay elemental units 110. The signal present at the output terminal of each delay elemental unit 110 of the chain is the external clock signal CLKA delayed by a fraction or delay value in relation to the total number N of the delay elemental units 110 of the chain. In particular, for the n-th delay elemental unit 110 of the chain, where n is the delay value of the respective output signal is equal to [n*(1/N)] with respect to the period of the external clock signal CLKA.

In particular, the delay elemental units 110 have respective output terminals connected to a first select block or multiplexer MUX0 and to a second select block or multiplexer MUX1. The first multiplexer MUX0 and the second multiplexer MUX1, suitably driven, bring back to the respective output terminal, a first output signal OUT0 and a second output signal OUT1 selected by the input signals.

The first output signal OUT0 and the second output signal OUT1 are then clock signals being out of phase with respect to the external clock signal CLKA by a fraction of the period of the external clock signal CLKA in relation to the selected elemental unit 110. This fraction is n/N.

According to the present disclosure, the operation of the phase generator 10, and in particular of the first multiplexer MUX0 and of the second multiplexer MUX1 and of each delay elemental unit 110, is controlled by the control system 100. The control system 100 comprises a control unit 140 which, suitably activated by an external signal Start_ctrl, generates a first select signal mux_sel_ch_0 and a second select signal mux_sel_ch_1 for driving respectively the first multiplexer MUX0 and the second multiplexer MUX1. The first multiplexer MUX0 and the second multiplexer MUX1 thus bring back to the respective output terminals an output signal of the respective elemental unit 110 selected by defining the first output signal OUT0 and the second output signal OUT1.

Figure 3:
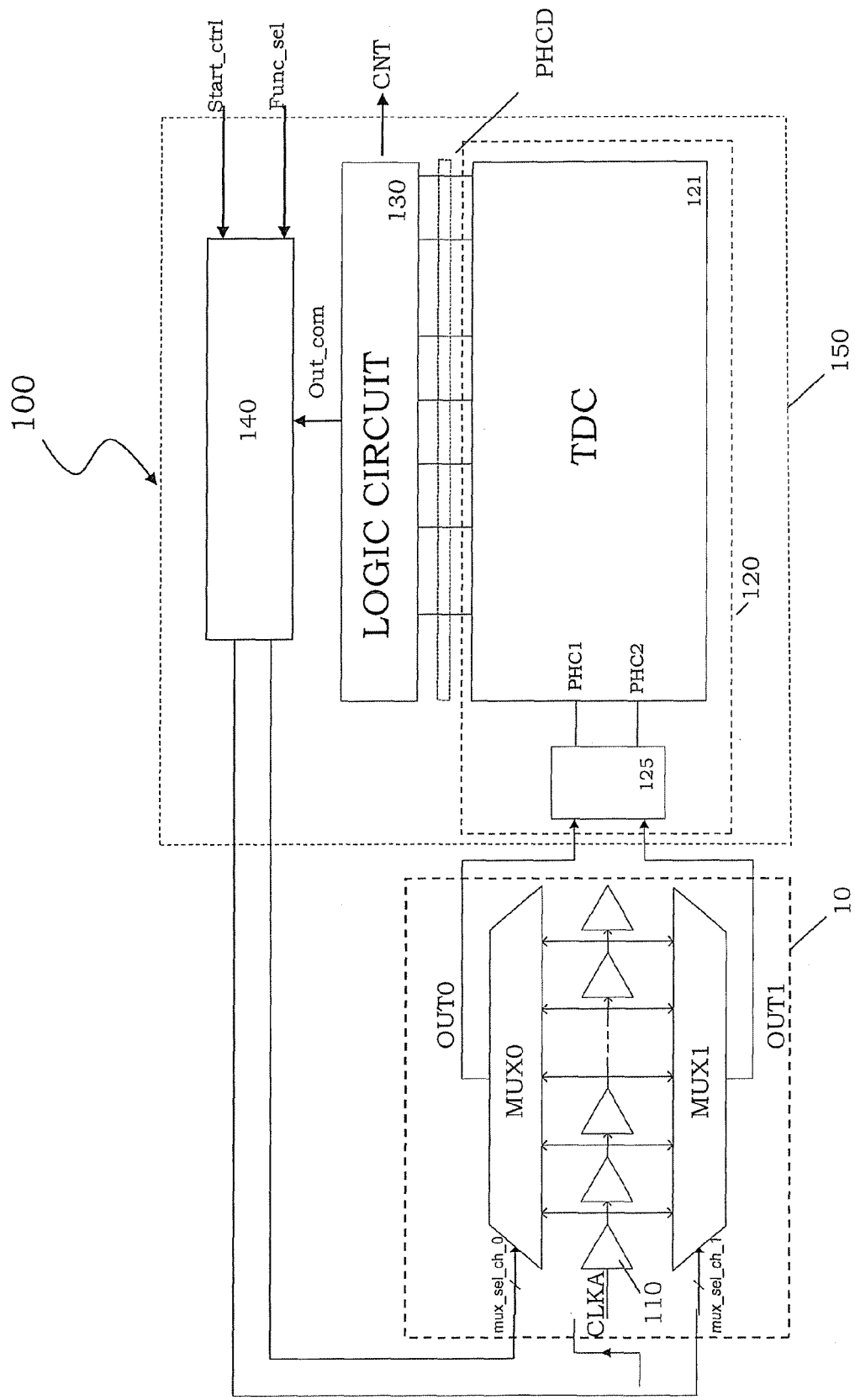
FIGS. 3 and 4 show detailed schematic block diagrams of the control system shown in FIG. 2.

The control system 100 also comprises a detect module 120 for detecting the phase difference between the first output signal OUT0 and the second output signal OUT1 and generating a corresponding digital phase shift signal P1-LCD. As shown in FIG. 3, substantially, the detect module 120 comprises a detector or phase comparator 125 connected at the output to a Time-Digital converter 121. The phase comparator 125 receives at the input the first output signal OUT0 and the second output signal OUT1 for generating a first comparator signal PHC1 and a second comparator signal PHC2, which identify the phase difference, detected in terms of time, between the signals selected. The first comparator signal PHC1 and the second comparator signal PHC2 are thus placed at the input of the Time-Digital comparator 121 which converts this time difference into a digital value, i.e. into the digital phase shift signal PHCD. Preferably, the detect module 120 also identifies the sign of the phase difference between the first output signal OUT0 and the second output signal OUT1.

Figure 4:
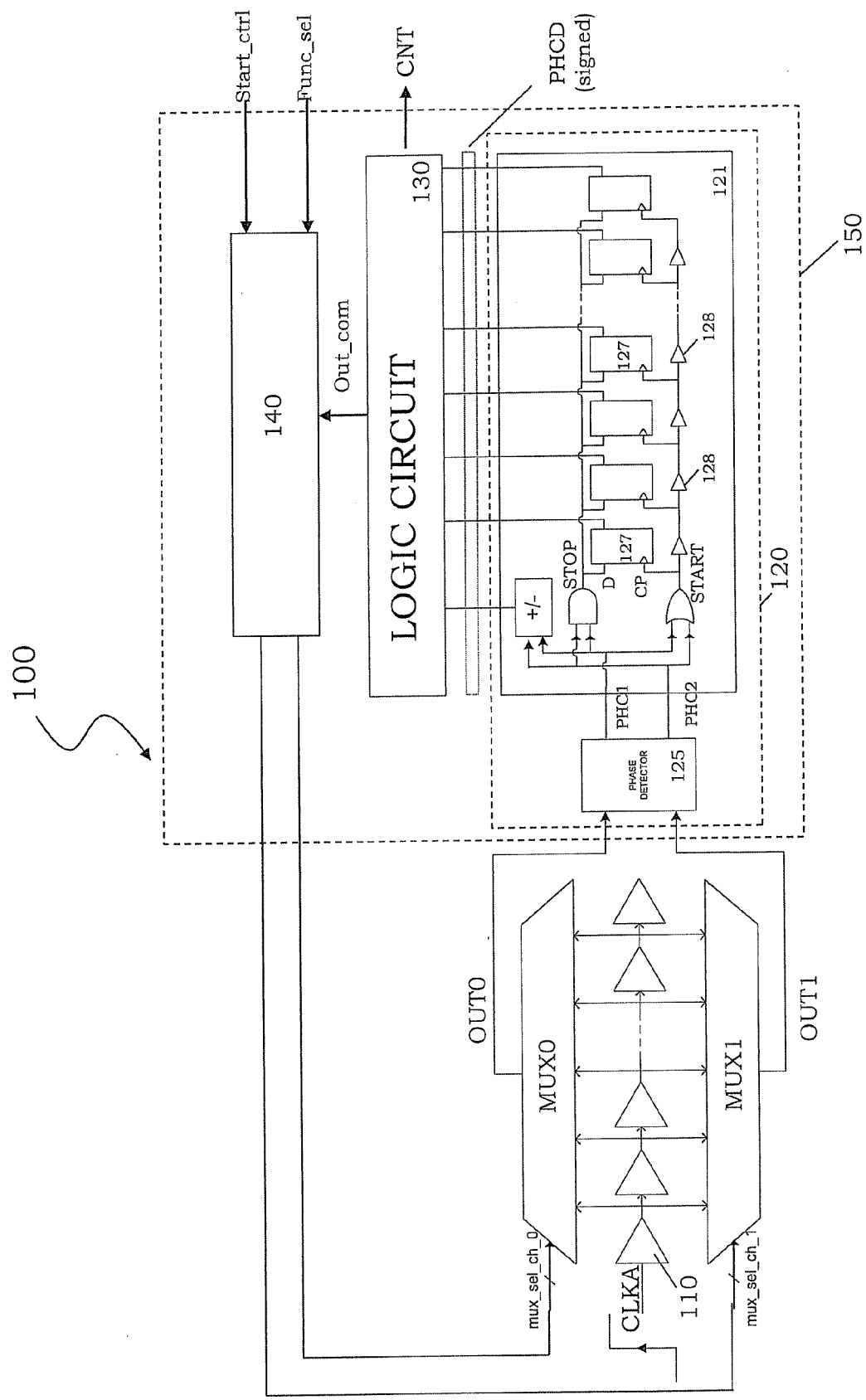

The control system 100 also comprises a logic control circuit 130 suitable for receiving the digital phase shift signal PHCD from the detect module 120 and with appropriates tables and/or programs suitably stored, and for carrying out a control on this digital phase shift signal PHCD so as to generate an output signal CNT indicative of the control executed. An example of Time-Digital converter circuit 121 is shown in FIG. 4 and comprises a plurality of logic elements 127, such as a Flip-Flop, connected to each other and having respective output terminals connected to the logic circuit 130. In particular, each Flip-Flop 127 substantially receives two input signals, the activation signal START, that takes high logic value H when the phase measure starts, and the deactivation signal STOP that takes high logic value H when this measure has ended. These signals are generated by processing through a logic circuit the first comparator signal PHC1 and the second comparator signal PHC2 supplied by the phase comparator 125. In the present embodiment, the logic circuit comprises a logic gate AND and a logic gate OR both receiving the first comparator signal PHC1 and the second comparator signal PHC2.

The activation signal START is connected to a first input CP of the Flip-Flops 127 and propagated by a Flip-Flop to the other with the interposition of a plurality of buffers 128 in cascade suitable for suitably delaying the activation signal START. The deactivation signal STOP is instead connected to the input D of each Flip-Flop 127. Naturally, the number of the Flip-Flops 127 substantially depends on the application and in particular on the range of values that the period of the external clock signal CLKA can take.

The logic circuit 130, once the Time-Digital conversion has ended, tests the status of the Flip-Flops 127, in particular the signals present on the respective output terminals which represent the digital phase shift signal PHCD, and according to their high H or low L status, and possibly with suitable processing, outputs the output digital signal CNT indicative of the control executed. Prearranged control tables and suitable programs storable in the logic circuit 130 allow to process and then analyze and interpret the digital phase shift signal PHCD, in relation to the measures executed.

The control unit 140 receives from the logic circuit 130 a plurality of control signals out_com, one of which identifies the end of the control that was being carried out and other signals that identify possible problems found during this control. The control unit 140, according to appropriate test programs suitably storable and by processing the same control signal out_con, arranges respectively the first select signal mux_sel_ch_0 and the second select signal mux_sel_ch_1 for the successive control at the phase generator 10.

In this way, the logic circuit 130 and the control unit 140 can arrange the successive control, not only according to typologies of predetermined and stored measures but also according to considerations on the signal CNT indicative of the control just executed. In other words, the control system 100 according to the present disclosure allows for carrying out type of testing that according to suitable programs and in an algorithmic mode can be self-adapted to the real operation status of the phase generator 10, i.e. they allow specific measures according to the controls executed.

Naturally, the control unit 140 could be realized inside the control circuit 130 in a single circuit block according to the needs and to the design layout. The present disclosure also relates to a control method for a phase generator as previously described for which details and cooperating parts having the same structure and function may be indicated with the same reference numbers and acronyms.

In particular, the phase generator 10 is realized with a circuit DLL/PLL comprising a delay block VCDL having a chain of delay elemental units 110 connected in cascade to each other. The delay elemental units 110 are interposed between an input terminal, suitable for receiving an external clock signal CLKA, and an output terminal of the phase generator 10, suitable for generating a delayed clock signal CLKB. This delayed clock signal CLKB is delayed exactly by a clock cycle with respect to the external clock signal CLKA.

The delay block VCDL is controlled in feedback by a feedback block 11 that generates voltage control signal Vc by comparing the delayed clock signal CLKB with the external clock signal CLKA. The phase generator 10 also comprises a first multiplexer MUX0 and a second multiplexer MUX1, which receive at the input the output signals of each delay elemental unit 110 of the delay block VCDL for supplying a first output signal OUT0 and a second output signal OUT1 respectively selected by the input signals.

The method comprises the steps of generating a first select signal mux_sel_ch_0 for driving the first multiplexer MUX0, which selects a corresponding elemental unit and brings back to the output terminal as first output signal OUT0 the output signal of the elemental unit selected, and generating a second select signal mux_sel_ch_1 for driving the second multiplexer MUX1 and bringing back to the output terminal the second output signal OUT1. The method further comprises the steps of detecting the phase difference between the first output signal OUT0 and the second output signal OUT1 for generating a corresponding phase shift signal PHC, and digitizing the phase shift signal PHC detected by employing a Time-Digital converter 121, realized with a plurality of logic elements 127, for generating a digital phase shift signal PHCD, and processing the digital phase shift signal PHCD obtained for generating a signal CNT indicative of the control executed.

In particular, the detection of the phase difference between the first output signal OUT0 and the second output signal OUT1 occurs by employing detection module 120 that with a detector or phase comparator 125, defines a time interval corresponding to the phase difference. The method provides generation with the phase comparator 125 a first comparator signal PHC1 and a second comparator signal PHC2 for driving the Time-Digital converter 121.

According to an embodiment, the Time-Digital converter 121 is realized by arranging a plurality of logic elements 127 and connecting the respective output terminals to a logic circuit 130. Two input signals are then supplied to each Flip-Flop 127: the activation signal START which supplied to a first terminal CP of each Flip-Flop by the phase detector 125 through a first logic gate OR and propagated by a Flip-Flop 127 to the other through the interposition of a plurality of buffers 128 in cascade; and a deactivation signal STOP which is also supplied by the phase detector 125 through a second input logic gate AND, the deactivation signal STOP being supplied to a second input terminal D of each Flip-Flop 127.

The logic circuit 130 tests the status of the output terminal of each Flip-Flop 127, which corresponds to the digital phase shift signal PHCD, and with logic and algorithmic operations quickly processes and evaluates the output digital signal CNT indicative of the control executed. The method also provides the step of arranging further controls at the phase generator 100 generating in a programmed mode a further first select signal mux_sel_ch_0 and a further second select signal mux_sel_ch_1.

Suitably, according to an embodiment, the method provides to control the control unit 140 with the generation of one or more control signals out_com from the logic circuit 130 that has processed the digital phase shift signal PHCD. Then, according to suitable test programs stored in the control unit 140 and according to the same control signal out_com, the control unit 140 arranges the further first select signal mux_sel_ch_0 and the further second select signal mux_sel_ch_1 for the successive control at the phase generator 10. Suitably, an external signal Start_ctrl is received by the control unit 140 for the activation and the deactivation of the same that also allows the activation and the deactivation of the control circuit 100.

Naturally, the control system and the control method according to the present disclosure present some variations. In particular, the Time-Digital converter circuit 121 can be realized with other equivalent embodiments comprising some logic elemental units. The present disclosure also relates to a phase generator 10 comprising a delay block VCDL having a chain of delay elemental units 110, a first multiplexer MUX0 and a second multiplexer MUX1, suitable for selecting respectively an output of a delay elemental unit 110 of the chain, for supplying a first output signal OUT0 and a second output signal OUT1. The phase generator 10 also comprises a control system 100 as previously described.

Naturally, in one embodiment, the control system 100 could be realized on-board, i.e. integrated with the phase generator 10, and be suitably activated on demand or activated in a programmed mode for a periodic control. Alternatively, the control system 100 could be realized as single device and be selectively connected to the phase generator 10 for the suitable controls.

Figure 5:
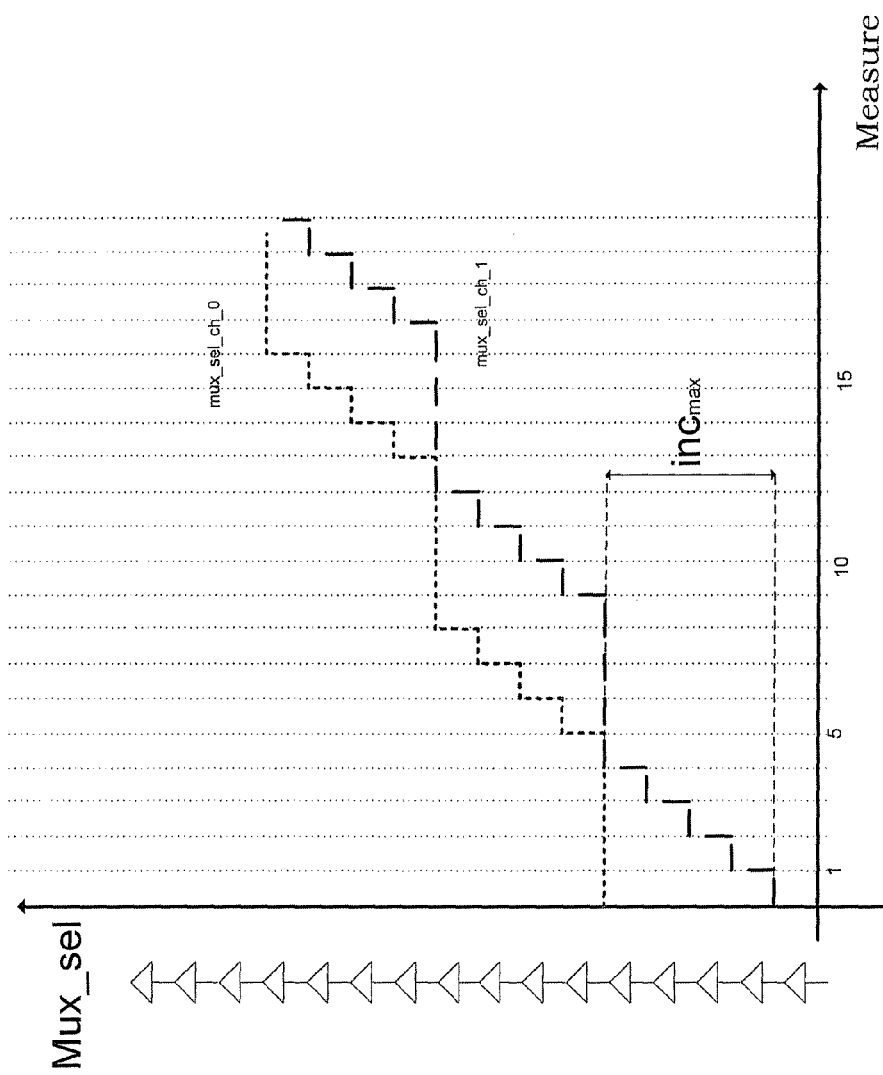
FIGS. 5 and 6 show diagrams of test cases in the control system, according to the present invention.
Figure 6:
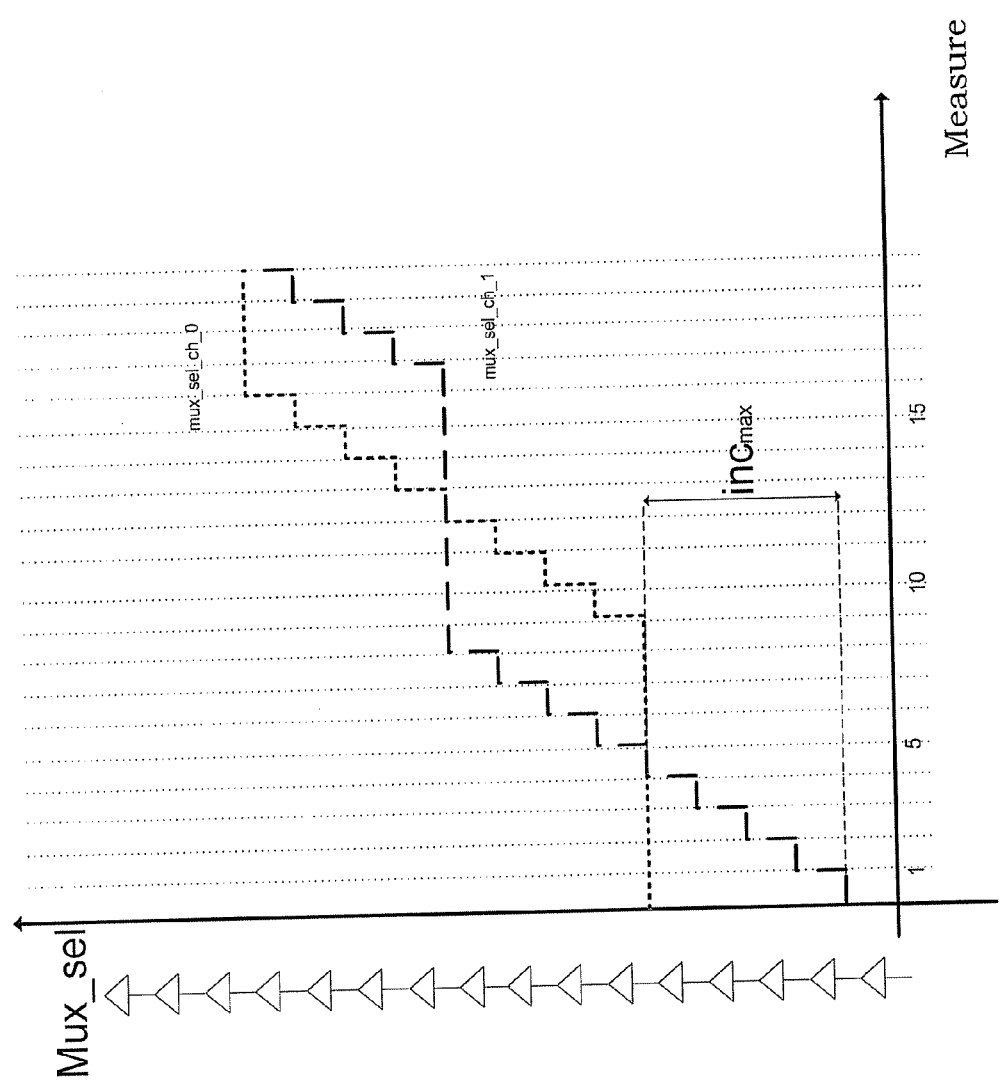

FIGS. 5 and 6 show two possible diagrams relative to test methods that can be carried out with the control circuit according to the present disclosure, for defining in particular the functionality of the first multiplexer MUX0, of the second multiplexer MUX1 and of the delay block VCDL. In both the graphs, the signal indicated with short broken lines shows the behavior of the first select signal mux_sel_ch_0 while the signal indicated with long broken lines shows the behavior of the second select signal mux_sel_ch_1.

The test method shown in FIG. 5 substantially provides to maintain/fix a multiplexer on an output of an elemental unit 110 of the delay block VCD while the other multiplexer "brushes" a group of outputs of a sequential set of delay elemental units 110. Initially, the first output signal OUT0 and the second output signal OUT1 have a phase difference equal to four delays of the elemental units 110. Naturally, this value is arbitrary and chosen according to the application, it defines a maximum increase $inc_{max}$.

The method then provides the unitary increase of the value of the second select signal mux_sel_ch_1 until the value of the first select signal mux_sel_ch_0 is equalized. In this way at each new test, the phase difference between the first OUT0 and the second output signal OUT1 may be reduced by a value equal to the delay introduced by a signal delay elemental unit 110 up to a void phase difference, in the present embodiment at the fifth test. The test method provides then to increase in a unitary way the value of the first select signal mux_sel_ch_0 until it reaches the maximum difference expressed by the maximum value $inc_{max}$, i.e. after further four tests, while the second select signal mux_sel_ch_1 is maintained constant.

The above described process is then repeated until the N-th elemental unit 110 present in the delay block VCDL is tested. At each test, the detection module 120 and in particular the phase comparator 125 detects the value of the phase difference between the first output signal OUT0 and the second output signal OUT1 and drives the Time/Digital converter 121, that supplies the digital phase difference. This value is then analyzed by the logic circuit 130 according to predetermined tables and/or programs generating the output signal CNT indicative of the control executed as well as generating the plurality of signals out_com so as to start the successive test increasing in a unitary way the value of the first select signal mux_sel_ch_0 or of the second select signal mux_sel_ch_1 according to the predetermined scheme.

FIG. 6 shows an alternative test method that, with respect to the previous one, provides to maintain the first select signal mux_sel_ch_0 constant, to detect the output of the fifth elemental unit 110 of the delay block VCDL, while the second select signal mux_sel_ch_1 sequentially tests the outputs of the elemental units 110 from the first to the tenth. Subsequently, the first select signal mux_sel_ch_0 is increased in a unitary way while the second select signal mux_sel_ch_1 is maintained constant.

The first output signal OUT0 and the second output signal OUT1 detected initially by the first select signal mux_sel_ch_0 and by the second select signal mux_sel_ch_1 have a phase difference equal to four delays of the elemental units 110 and this corresponding to a maximum value $inc_{max}$. At each new test, the phase difference between the first OUT0 and the second output signal OUT1 may be reduced by a value equal to the delay introduced by the single elemental unit 110 until tests with void phase shift are obtained. The method provides then to continue to increase in a unitary way the value of the second select signal mux_sel_ch_1 until the maximum phase difference expressed by $inc_{max}$ is attained after further four tests. Subsequently, the first select signal mux_se ch_0 is increased in a unitary way until the output of the same elemental unit 110 is tested with a phase difference between the first OUT0 and the second void output difference OUT1 (after successive four tests). The method is repeated until the maximum difference of the output signals expressed by $inc_{max}$ is once again attained after successive further four tests.

An advantage of the control system and of the control method according to the present disclosure is given by the precision and by the quickness of execution of the types of tests, thanks to the use of the Time-Digital converter, which comprises conversion logic means or a conversion logic circuit, and to the logic circuit suitably programmed which allows to analyze the digital phase shift signal and, in an algorithmic way, to generate the control signal.

Another advantage of the present disclosure is the control speed obtained thanks to the use of the Time-Digital circuit converter which measures time intervals with the logic elements, such as the Flip-Flops, also obtaining a high precision of the phase shift detected.

Another advantage is the versatility of the present disclosure, which can be integrated directly with a phase generator realized with circuits DLL/PLL. In this case, the control system can be activated in an automatic way or on the user's demand, thus allowing a wider use and a substantial reduction of the control times. Another advantage of the present disclosure is the possibility to realize the control system separately with respect to the phase generator and use this instrument on existing phase generators allowing to remarkably reduce the test time and to increase the precision with respect to the instruments of the prior art.

Another advantage of the present disclosure is the possibility to realize a control system that besides substantially reducing the test times is obtained at reduced costs. Another advantage of the present disclosure is the possibility to carry out tests in an algorithmic way. Obviously the system and the method above described can be subjected to modifications by a technician of the field so as to meet specific and incidental needs, these modifications and further embodiments all being comprised within the scope of protection of the disclosure as defined by the following claims.

That which is claimed:

1. A control system for a phase generator comprising a delay block including a chain of delay units, and first and second multiplexers each configured to receive output signals of each of the delay units and to respectively supply first and second output signals, the control system comprising:
   a controller configured to drive the first multiplexer and the second multiplexer respectively with a first select signal and a second select signal;
   a phase comparator; and
   a Time-Digital converter circuit coupled to said phase comparator and configured to generate a digital phase shift signal based upon a phase difference between the first output signal and the second output signal.

2. The control system according to claim 1 further comprising a logic circuit connected to said Time-Digital converter circuit and configured to process the digital phase shift signal and to generate a signal indicative of a control executed.

3. The control system according to claim 1 wherein said phase comparator is configured to receive the first output signal and the second output signal and to drive said Time-Digital converter circuit with a first comparator signal and a second comparator signal.

4. The control system according to claim 2 wherein said Time-Digital converter circuit comprises a plurality of logic elements, each logic element has a respective output terminal connected to said logic circuit.

5. The control system according to claim 2 wherein said controller is configured to receive at least one control signal from said logic circuit for generating the first and second select signals.

6. The control system according to claim 2 wherein said logic circuit and said controller each operate based upon a respective test program.

7. A phase generator comprising:
   a delay block including a chain of delay units;
   first and second multiplexers each configured to receive output signals of each of the delay units and to respectively supply first and second output signals; and
   a control system comprising
      a controller configured to drive the first multiplexer and the second multiplexer respectively with a first select signal and a second select signal,
      a phase comparator, and
      a Time-Digital converter circuit coupled to said phase comparator and configured to generate a digital phase shift signal based upon a phase difference between the first output signal and the second output signal.

8. The phase generator according to claim 7 wherein said control system further comprises a logic circuit connected to said Time-Digital converter circuit and configured to process the digital phase shift signal and to generate a signal indicative of a control executed.

9. The phase generator according to claim 7 wherein said phase comparator is configured to receive the first output signal and the second output signal and to drive said Time-Digital converter circuit with a first comparator signal and a second comparator signal.

10. The phase generator according to claim 8 wherein said Time-Digital converter circuit comprises a plurality of logic elements, each logic element has a respective output terminal connected to said logic circuit.

11. The phase generator according to claim 8 wherein said controller is configured to receive at least one control signal from said logic circuit for generating the first and second select signals.

12. The phase generator according to claim 8 wherein said logic circuit and said controller each operate based upon a respective test program.

13. A method for operating a phase generator comprising a delay block including a chain of delay units, and first and second multiplexers configured to receive output signals of each of the delay units and to respectively supply first and second output signals, the method comprising:
   generating a first select signal for driving the first multiplexer for supplying the first output signal and generating a second select signal for driving the second multiplexer suitable for supplying the second output signal;
   detecting a phase difference between the first output signal and the second output signal and generating a corresponding digital phase shift signal by using a Time-Digital converter; and
   processing the digital phase shift signal for generating a signal indicative of a control executed.

14. The method according to claim 13 further comprising generating a first comparator signal and a second comparator signal using a phase comparator controlled by the first output signal and by the second output signal for driving a plurality of logic elements of the Time-Digital converter, the phase comparator connecting the plurality of logic elements to a logic circuit for processing the digital phase shift signal.

15. The method according to claim 14 further comprising generating the first and second select signals to provide processing of at least one control signal generated by the logic circuit.

16. The method according to claim 14 wherein the logic circuit is based upon a testing program.

* * * * *

UNITED STATES PATENT AND TRADEMARK OFFICE
CERTIFICATE OF CORRECTION

PATENT NO. : 8,183,904 B2
APPLICATION NO. : 12/980486
DATED : May 22, 2012
INVENTOR(S) : Giovannone et al.

Page 1 of 1

It is certified that error appears in the above-identified patent and that said Letters Patent is hereby corrected as shown below:

Column 1, Line 60   Delete: "MUX0 comes comprises"
                    Insert: --MUX0 comprises--

Column 4, Line 36   Delete: "n is the"
                    Insert: --n is $1 \leq n \leq N$, the--

Column 5, Line 1    Delete: "signal P1-LCD."
                    Insert: --signal PHCD.--

Column 5, Line 19   Delete: "and with appropriates"
                    Insert: --and with appropriate--

Signed and Sealed this
Twenty-fourth Day of July, 2012

David J. Kappos
*Director of the United States Patent and Trademark Office*